United States Patent
Zhu

(10) Patent No.: US 7,795,956 B2
(45) Date of Patent: Sep. 14, 2010

(54) MULTI FORMAT VIDEO FILTER DESIGN

(75) Inventor: Xiaoming Zhu, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 68 days.

(21) Appl. No.: 12/234,934

(22) Filed: Sep. 22, 2008

(65) Prior Publication Data

US 2010/0074550 A1 Mar. 25, 2010

(51) Int. Cl.
*H03B 1/00* (2006.01)
(52) U.S. Cl. .................................................. 327/558
(58) Field of Classification Search ................ 327/551, 327/552, 553, 555, 558
See application file for complete search history.

(56) References Cited

U.S. PATENT DOCUMENTS 6,838,946 B2 * 1/2005 Bazarjani ...................... 331/16

* cited by examiner

*Primary Examiner*—Jeffrey S Zweizig
(74) *Attorney, Agent, or Firm*—Robert D. Marshall, Jr.; W. James Brady; Frederick J. Telecky, Jr.

(57) ABSTRACT

Current generation digital media processors support multi-format video resolutions, SDTV, Progressive Scan and HDTV. Built-in video encoders directly support NTSC and progressive 480P video outputs. These two video formats have different image bandwidth and output gain requirements, but are normally filtered by fixed bandwidth filters. This invention provides adjustable filter bandwidth for improved video filtering and solves the dilemma on filter bandwidth design for multi-format video applications. The invention is applicable to video reconstruction filter applications requiring bandwidth adjustable filters.

2 Claims, 4 Drawing Sheets

MULTI FORMAT VIDEO FILTER DESIGN

TECHNICAL FIELD OF THE INVENTION

The technical field of this invention is video filtering.

BACKGROUND OF THE INVENTION

New generation digital media processors support multi-format resolutions among which are standard density TV (SDVT), progressive scan and high density TV (HDTV). The built-in video encoder of these new media products directly supports national television standards committee specification (NTSC) and the progressive scan 480P video standard specification. These two video formats have different sampling rate requirements for different video signal bandwidth. NTSC video bandwidth is about 4.2 MHz to 5 MHz and requires video filter with cutoff frequency at about 6.25 MHz. Progressive scan 480P requires cutoff frequency at about 12.5 MHz for its wider video bandwidth filtering.

When the video encoder digital-to-analog (DAC) outputs NTSC signals a gain of 5.3 is needed in order to meet international television standards (ITU) video standard on level requirement. However, when the media processor outputs progressive scan 480P video in component video or RGB signals, the video standards require a gain of 4. Thus a design employing a fixed-bandwidth filter and gain can meet only limited video format requirements. Accordingly there is a need in the art for a video encoder and filter able to operate in plural video formats.

SUMMARY OF THE INVENTION

Current generation digital media processors support multi-format video resolutions, such as standard density TV (SDTV) and progressive scan and high density TV (HDTV). Built-in video encoders directly support NTSC and progressive 480P video outputs. These two video formats have different image bandwidth and output gain requirements, but are normally filtered by fixed bandwidth filters. This invention provides adjustable filter bandwidth for improved video filtering and solves the dilemma regarding filter bandwidth for multi-format video applications. The invention is applicable to video reconstruction filter applications requiring bandwidth adjustable filters.

BRIEF DESCRIPTION OF THE DRAWINGS

These and other aspects of this invention are illustrated in the drawings, in which.

DETAILED DESCRIPTION OF PREFERRED EMBODIMENTS

A filter design of fixed frequency response and gain meets only one video format requirement. Some designs have previously used simple filters with wider bandwidth to provide filtering for progressive video and passed SDTV with little or no filtering. The present invention is a filter providing adjustable filter bandwidth and gain control at nominal cost and power consumption.

Figure 1:
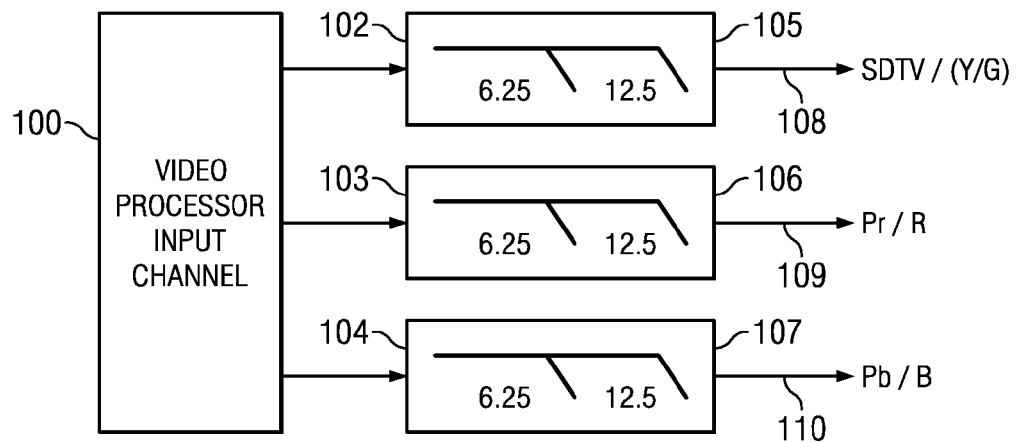
FIG. 1 illustrates the bandwidth requirements for digital media processors supporting multi-format video (Prior Art)

FIG. 1 illustrates the bandwidth requirements for digital media processors supporting multi-format video. The video processor input channel 100 supplies luminance component 102 and chrominance components 103 and 104 to the three respective filter networks 105, 106 and 107. When video processor input channel 100 outputs SDTV 108, the filters 105, 106 and 107 use a cutoff frequency fc=6.25 MHz. When video processor input channel 100 outputs progressive scan 480P in RGB format, filters 105, 106 and 107 use a cutoff frequency fc=12.5 MHz. For the Y—Pr—Pb format, filter 105 for the Y component uses a cutoff frequency fc=12.5 MHz while filter 106 for the Pr component and filter 107 for Pb component use fc=6.25 MHz.

Low pass filter (LPF) designs normally have a topology with a serial inductor in the video signal path and a capacitor in shunt to ground. Changing the shunt capacitance by switching in another capacitance can easily change the filter bandwidth. This apparently simple low cost solution has significant mathematical complications.

Figure 2A:
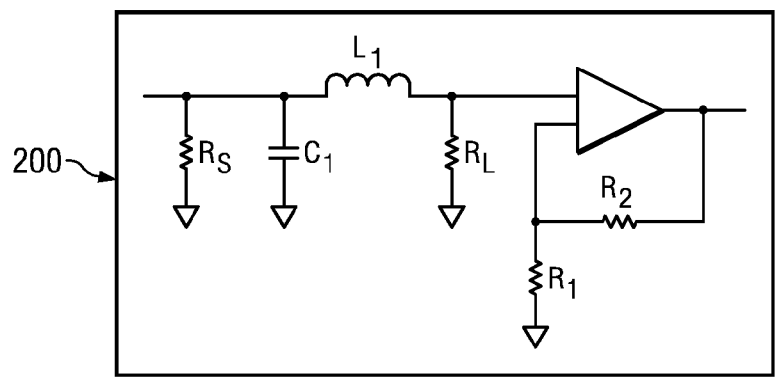
FIGS. 2A, 2B, and 2C together illustrate the circuit configurations of second, fifth, and sixth order low pass filters (Prior Art)

FIG. 2A illustrates a basic second order low pass filter 200. Filter 200 illustrated in FIG. 2 includes shunt resistance $R_S$, shunt capacitance $C_1$, serial inductor L1 and shunt resistor $R_L$. These drive an operational amplifier having a gain dependent upon the relative resistance values of resisters $R_1$ and $R_2$. Filter 200 has a transfer function:

$$H(S) = \frac{(R_1 + R_2)/R_1}{C_1 L_1 S^2 + \left(R_S C_1 + \frac{L_1}{R_L}\right)S + \frac{R_S}{R_L} + 1} \quad (1)$$

The normalized transfer function for this filter with equal termination resistance values ($Rs=R_L$) is:

$$h(s) = \frac{(R_1 + R_2)/R_1}{\lambda c s^2 + (\lambda + c) + 2} \quad (2)$$

where:

$$\lambda = \frac{L 2\pi f_C}{2 R_L} \quad (3)$$

and $$c = R_L C 2\pi f_C$$

The ladder filters illustrated in FIG. 2 have conventionally been implemented in Butterworth or Bessel designs but the Butterworth filter has been found to have phase linearity characteristics preferable to the Bessel filter. The circuit of FIG. 2A is known as a second order Butterworth filter.

The transfer function of the second order Butterworth filter of the type illustrated in FIG. 2A is given by $$h(s) = \frac{1}{s^2 + \sqrt{2} s + 1} = \frac{1}{A_2 s^2 + A_1 s + A_0} \quad (4)$$

To implement second order Butterworth filter, first set:

$$\lambda c = a A_2 \text{ and } \lambda + c = 2 A_1 \quad (5)$$

Solving equations (5) simultaneously yields:

$$\lambda = A_1 \pm \sqrt{A_1^2 - 2A_1} \quad (6)$$

With $$A_1^2 = 2A_2 \quad (7)$$

in the 2nd order Butterworth polynomial, we have:

$$\lambda = A_1 \text{ and } c = A_1 \quad (8)$$

Therefore the result is the following two equations:

$$C = \frac{2}{2\pi f_C R_L} \quad (9)$$

$$L = \frac{\sqrt{2} \times R_L}{2\pi f_C} \quad (10)$$

In equations (9) and (10) a change in $f_c$ requires a change in both L and C. Thus it is impossible to change second order Butterworth filter bandwidth from one cutoff frequency to another frequency by adjusting only capacitance and retaining fixed inductance. Both L and C have to be adjusted when cutoff frequency $f_c$ varies. This is true not only in second order filter, but can be shown mathematically as also true in higher order filters.

Figure 2B:
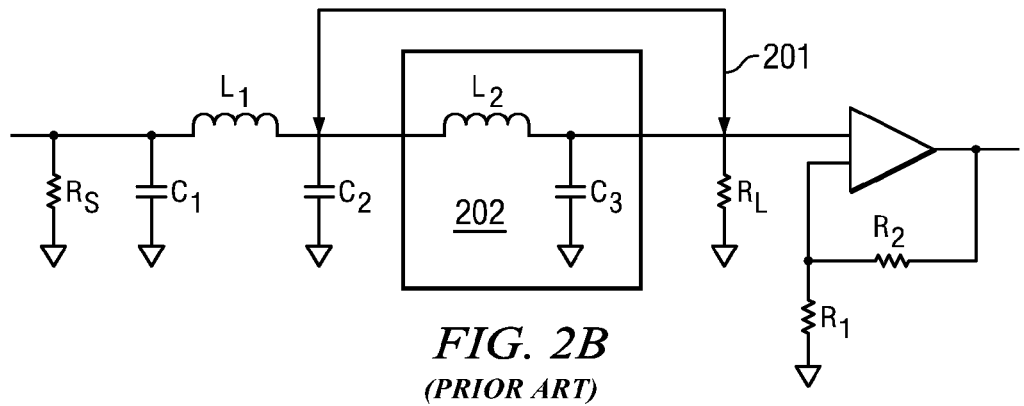
Figure 2C:
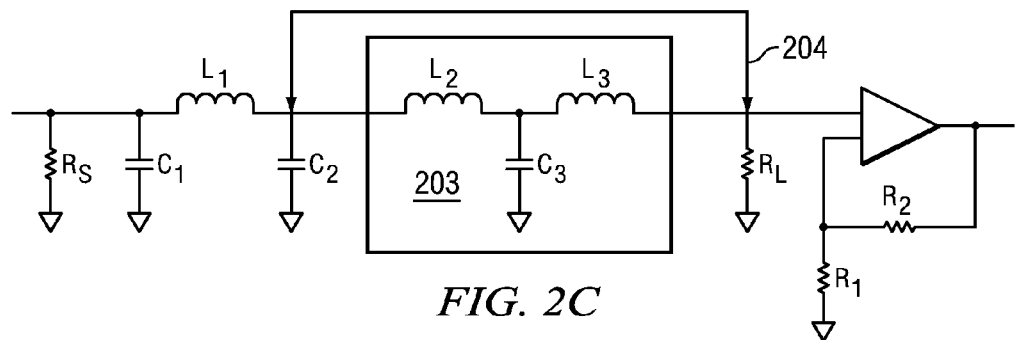

FIGS. 2B and 2C illustrate circuit configurations for fifth and sixth order Butterworth filters. These filters have been widely used in LPF design. These will be further described below Table 1 lists the capacitances and inductances of other higher order Butterworth filters derived mathematically similar to equations (9) and (10).

$$L_1 = \frac{\sqrt{2} \times R_L}{2\pi f_C}$$

Extensive analysis has shown that it is not possible to meet both NTSC broadcast standards and 480P video standards using an adjustable filter of a given order by half frequency without adjusting both the inductances and capacitances. On the other hand transforming the filter from one order to another order allows adjustment of bandwidth to be achieved by adjusting only the capacitance values. Considering only third to sixth order Butterworth filters, there are 56 possible filter pairs.

Table 1 shows that two pairs of Butterworth filters have a transform meeting the design requirements of both NTSC and 480P formats. These two pairs are: fifth order filter and third order filter; and sixth order filter and third order filter.

FIG. 2B illustrates the change required to convert a fifth order filter into a third order filter. A third order filter is implemented using bypass connection 201. A fifth order filter removes the bypass connection 201 and inserts the components of block 202 consisting of serial inductor $L_2$ and shunt capacitor $C_3$.

FIG. 2C illustrates the change required to convert a sixth order filter into a third order filter. A third order filter is implemented using bypass connection 203. A sixth order removes the bypass connection 203 and inserts the components within the block 204 consisting of serial inductors $L_2$ and $L_3$ and shunt capacitor $C_3$.

Holding inductance values constant for a given filter, a change from sixth order to third order requires that:

$$(L_1 + L_2)_{6th} = (L_1)_{3rd} \quad (12)$$

TABLE 1

| Order | C1 | L1 | C2 | L2 | C3 | L3 |
|---|---|---|---|---|---|---|
| 1 | $\frac{2}{2\pi f_c R_L}$ | | | | | |
| 2 | $\frac{\sqrt{2}}{2\pi f_c R_L}$ | $\frac{\sqrt{2} R_L}{2\pi f_c}$ | | | | |
| 3 | $\frac{1}{2\pi f_c R_L}$ | $\frac{2R_L}{2\pi f_c}$ | $\frac{1}{2\pi f_c R_L}$ | | | |
| 4 | $\frac{0.7654}{2\pi f_c R_L}$ | $\frac{1.8478 R_L}{2\pi f_c}$ | $\frac{1.8478}{2\pi f_c R_L}$ | $\frac{0.7654 R_L}{2\pi f_c}$ | | |
| 5 | $\frac{0.618}{2\pi f_c R_L}$ | $\frac{1.618 R_L}{2\pi f_c}$ | $\frac{2}{2\pi f_c R_L}$ | $\frac{1.618 R_L}{2\pi f_c}$ | $\frac{0.618}{2\pi f_c R_L}$ | |
| 6 | $\frac{0.5176}{2\pi f_c R_L}$ | $\frac{\sqrt{2} R_L}{2\pi f_c}$ | $\frac{1.9319}{2\pi f_c R_L}$ | $\frac{1.9319 R_L}{2\pi f_c}$ | $\frac{\sqrt{2}}{2\pi f_c R_L}$ | $\frac{0.5176 R_L}{2\pi f_c}$ |

To implement a second order Butterworth filter set:

$$C_1 = \frac{\sqrt{2}}{2\pi f_C R_L} \quad (11)$$

Table 1 gives the relationship between bandwidth and inductance values of a sixth order filter:

$$(L_1 + L_2)_{6th} = \frac{\sqrt{2} R_L}{2\pi f_6} + \frac{1.9319 R_L}{2\pi f_6} \quad (13)$$

Table 1 gives the relationship between bandwidth and inductance values of a third order filter:

$$(L_1)_{3rd} = \frac{2R_L}{2\pi f_3} \quad (14)$$

Solving (12), (13), and (14) simultaneously yields:

$$\left(\frac{\sqrt{2} R_L}{2\pi f_6} + \frac{1.9319 R_L}{2\pi f_6}\right) = \frac{2R_L}{2\pi f_3} \quad (15)$$

And the ratio of f3 to f6 is given by:

$$\frac{f_3}{f_6} = \frac{\frac{2R_L}{2\pi}}{\frac{\sqrt{2} R_L}{2\pi} + \frac{1.9319 R_L}{2\pi}} = \frac{1}{1.673} \quad (16)$$

Similarly, the ratio of f3 to f5 is given by:

$$(L_1 + L_2)_{5th} = \left(\frac{1.618 R_L}{2\pi f_5} + \frac{1.618 R_L}{2\pi f_5}\right) \quad (17)$$
$$= (L_1)_{3rd}$$
$$= \frac{2R_L}{2\pi f_3}$$

or $$\frac{f_3}{f_5} = \frac{\frac{2R_L}{2\pi}}{2 \times \frac{1.618 R_L}{2\pi}} = \frac{1}{1.618} \quad (18)$$

These equations indicate that if a sixth order Butterworth filter with cutoff frequency at $f_6$=12.5 MHz is designed for progressive 480P video, then a cutoff frequency at $f_3$=7.47 MHz (=12.5/1.673) of 3rd order could be reached by changing only the capacitances.

Alternatively, if a fifth order Butterworth filter with cutoff frequency at $f_s$=12.5 MHz is designed for progressive 480P video, then a cutoff frequency at $f_3$=7.725 MHz (=12.5/1.618) of third order could be reached by changing only the capacitances.

Figure 3:
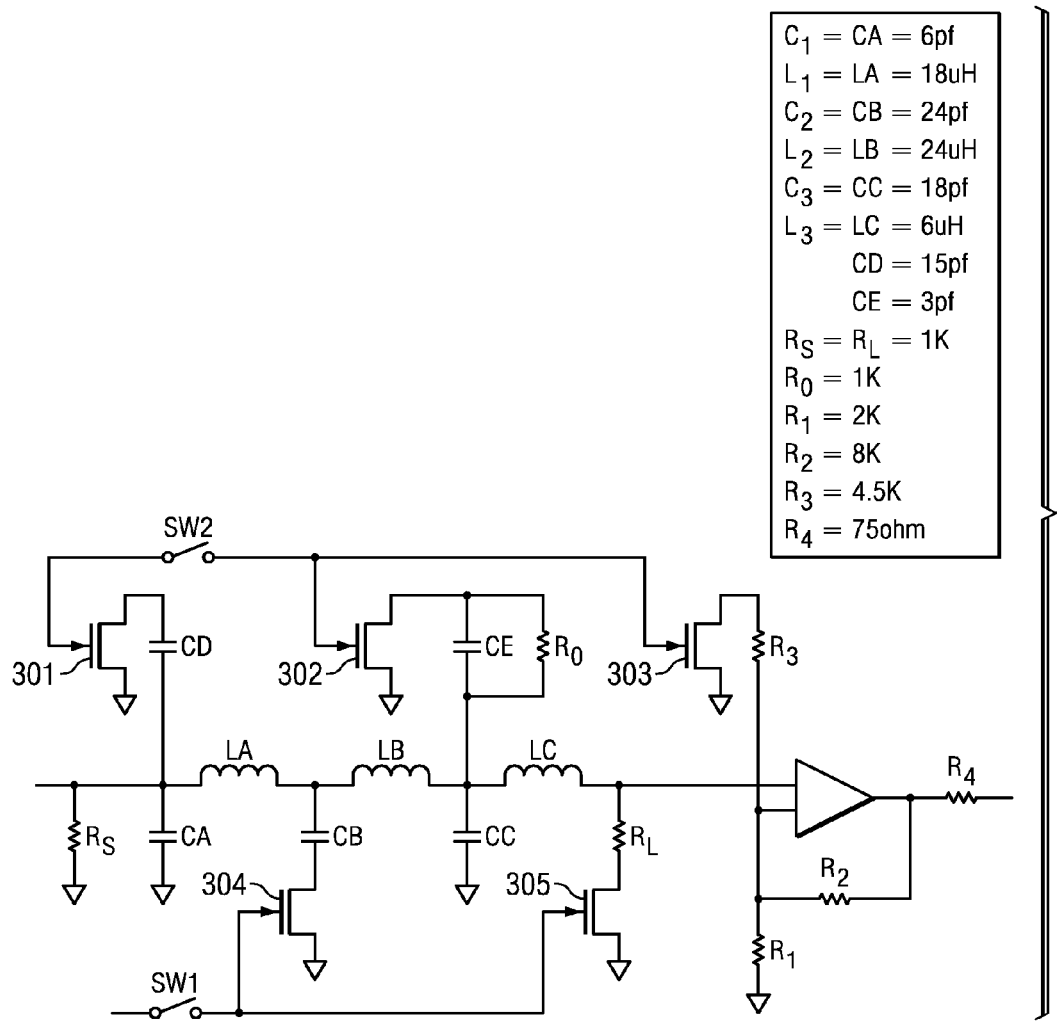
FIG. 3 illustrates a multi-format video filter implementation of the invention.

FIG. 3 illustrates the example of a sixth order Butterworth filter switchable to a third order Butterworth filter providing the solution for multi-format video filter implementation. This filter accomplishes the switching illustrated in FIG. 2C and has two −3 db cutoff frequencies: (a) 7.5 MHz for SDTV filtering; and (b) 12.5 MHz for 480P video filtering.

The filter bandwidth is selected by:

TABLE 2

| SW1 | SW2 | Butterworth Order | Cutoff Frequency |
|---|---|---|---|
| high | low | Sixth | 12.5 MHz |
| low | high | Third | 7.5 MHz |

Transistors 301, 302, 303, 304 and 305 are P-type metal oxide field effect transistors (MOSFET). These MOSFETs are conducting with a high voltage on the gate and non-conducting with a low voltage on the gate. High and low voltages are determined relative to the voltage threshold of the MOSFET. FIG. 3 lists the preferred component values.

Figure 4:
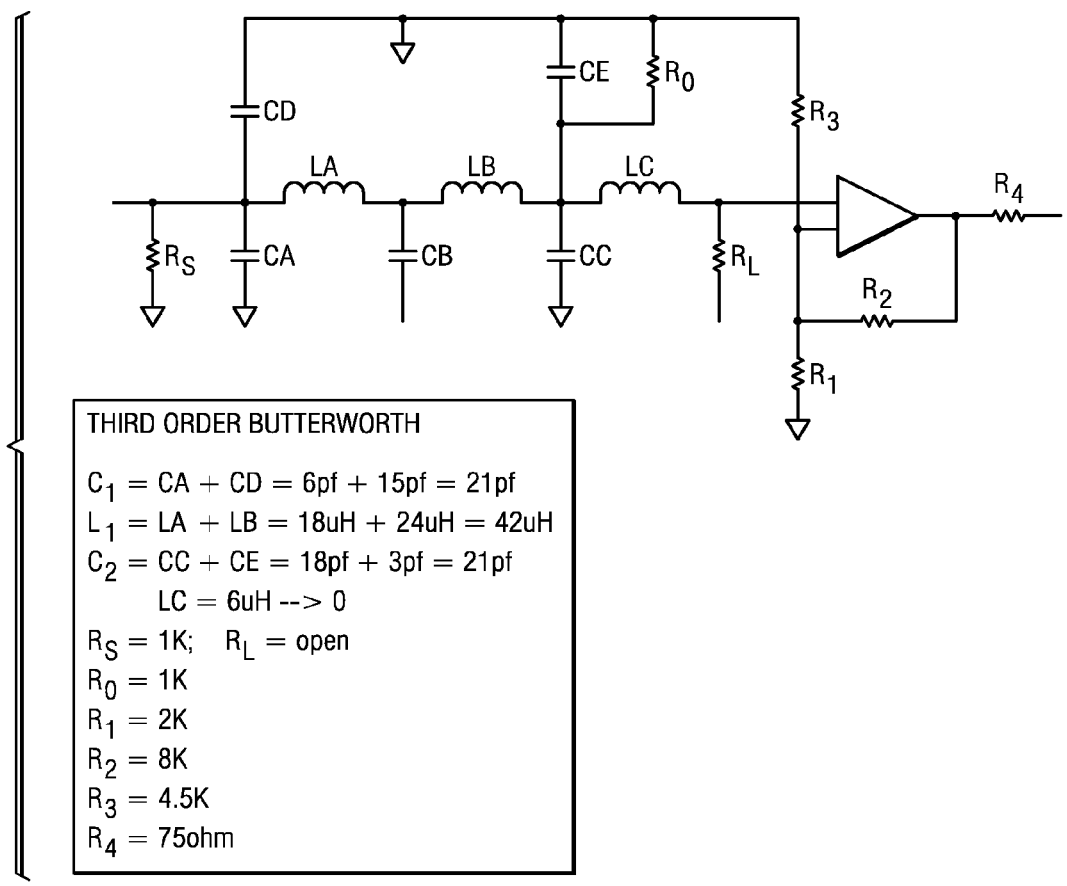
FIG. 4 illustrates a multi-format video filter of the invention with switches selecting a third order Butterworth configuration.

With SW1 low and SW2 high transistors 301, 302 and 303 are on, transistors 304 and 305 are off, and the circuit of FIG. 3 becomes the equivalent of the third order filter of FIG. 4. In this case: $C_1$ is CA in parallel with CD; and $C_2$ is CC in parallel with CE. CB and RL are floating and may be neglected. The contribution of LC is made negligible by isolation of RL.

Figure 5:
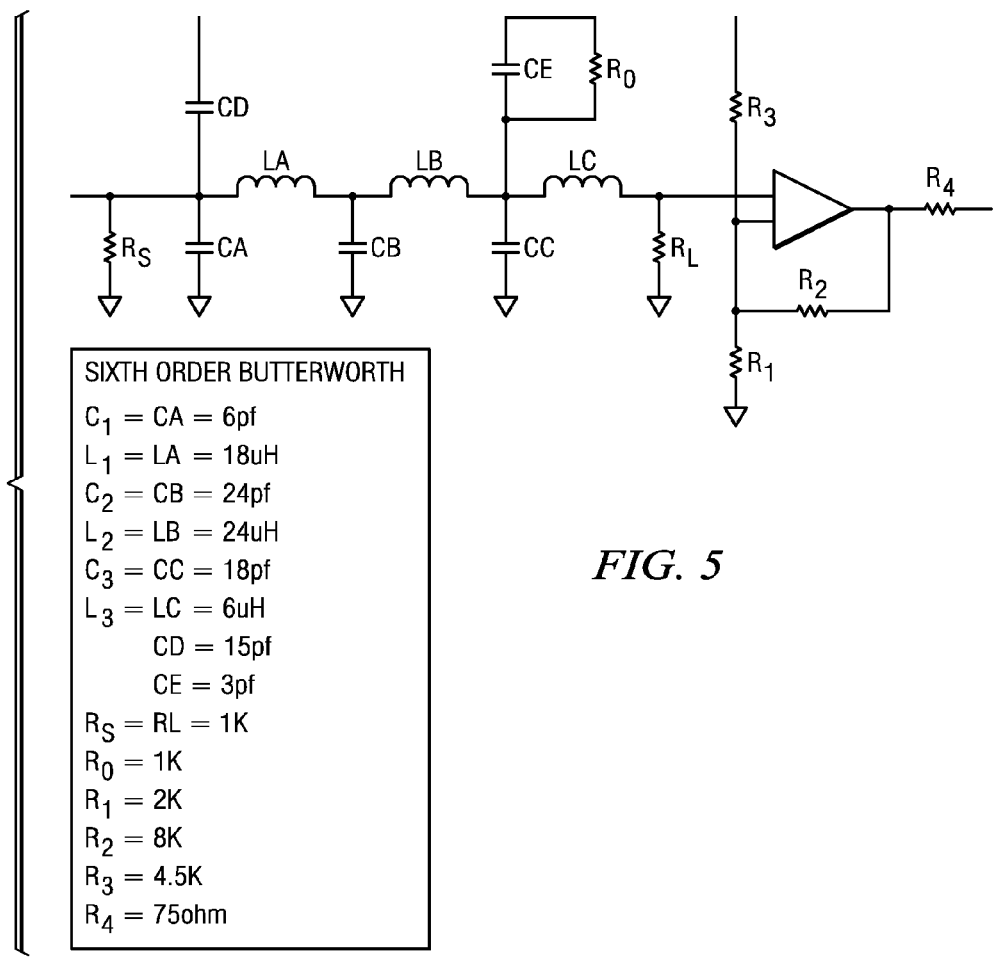
FIG. 5 illustrates a multi-format video filter of the invention with switches selecting a sixth order Butterworth configuration.

With SW1 high and SW2 low transistors 301, 302 and 303 are off, transistors 304 and 305 are on, and the circuit of FIG. 3 becomes the equivalent of the sixth order filter of FIG. 5. In this case: $C_1$ is CA; $L_1$ is LA; $C_2$ is CB; $L_2$ is LB; $C_3$ is CC; and $L_3$=LC. CD, CE, $R_0$ and $R_3$ are floating and may be neglected.

Figure 6:
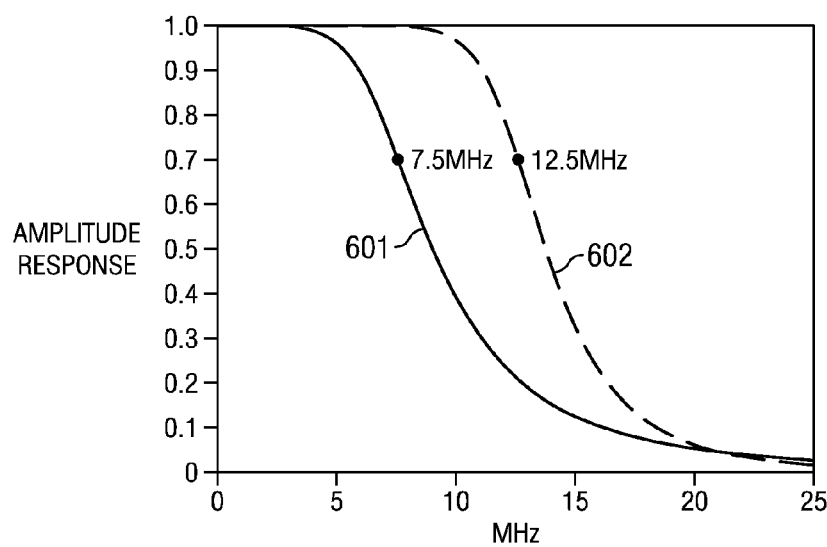
FIG. 6 illustrates the frequency response and delay characteristics of the sixth/third order video filter of FIG. 3.

FIG. 6 illustrates the frequency response characteristics of the sixth/third order video filter embodiment of this invention illustrated in FIG. 3. Curve 601 illustrates the condition when SW1 is low and SW2 is high having a cutoff frequency of 7.5 MHz. Curve 602 illustrates the condition when SW1 is high and SW2 is low having a cutoff frequency of 12.5 MHz.

What is claimed is:

1. A selectable low pass filter comprising:
   an input filter section including
      an input terminal,
      a first shunt resistor (Rs) connected between said input terminal and ground,
      a first shunt capacitor (CA) connected between said input terminal and ground, and
      a first series inductor (LA) connected between said input terminal and an output terminal of said input section;
   an output amplifier section including
      an operational amplifier having a first input forming an input of said output amplifier section, a second input and an output generating a output of said low pass filter,
      a feedback resistor ($R_2$) connected between said second input of said operational amplifier and said output of said operational amplifier, and
      a first gain control resistor ($R_1$) connected between said second input of said operational amplifier and ground; and
   a central filter section having an input connected to said output of said input section and an output connected to said input of said output amplifier section, said central filter section being selectively configurable into a first configuration having a first cutoff frequency and a second configuration having a second cutoff frequency different from said first cutoff frequency, wherein said central filter section includes
      a second series inductor (LB) connected between said input of said central filter section and an intermediate node of said central filter section,
      a second shunt capacitor (CC) connected between said intermediate node of said central filter section and ground,
      a third series inductor (LC) connected between said intermediate node of said central filter section and said output of said central filter section,
      a third shunt capacitor (CB) having a first terminal connected to said input of said central filter section and a second terminal,
      a first MOSFET (304) having a source-drain path connected between said second terminal of said third shunt capacitor (CB) and ground and a gate receiving a first control signal (SW1), a second shunt resistor ($R_L$) having a first terminal connected to said output of said central filter section and a second terminal, and a second MOSFET (305) having a source-drain path connected between said second terminal of said second shunt resistor ($R_L$) and ground and a gate receiving said first control signal (SW1), a fourth shunt capacitor (CD) having a first terminal connected to said input terminal and a second terminal, a third MOSFET (301) having a source-drain path connected between said second terminal of said fourth shunt capacitor (CD) and ground and a gate receiving a second control signal (SW2), a fifth shunt capacitor (CE) having a first terminal connected to said intermediate node of said central filter section and a second terminal, a third shunt resistor ($R_O$) having a first terminal connected to said intermediate node of said central filter section and a second terminal connected to said second terminal of said fifth shunt capacitor (CE), and a fourth MOSFET (302) having a source-drain path connected between said second terminal of said fifth shunt capacitor (CD) and ground and a gate receiving said second control signal (SW2);

wherein in said first configuration said first control signal (SW1) turns said first MOSFET (302) OFF and second MOSFET (303) OFF and said second control signal (SW2) turns said third MOSET (301) ON and said fourth MOSFET (302) ON; and wherein in said second configuration said first control signal (SW1) turns said first MOSFET (302) ON and second MOSFET (303) ON and said second control signal (SW2) turns said third MOSET (301) OFF and said fourth MOSFET (302) OFF.

2. The selectable low pass filter of claim 1, wherein:

said central filter section further includes a second gain control resistor ($R_3$) having a first terminal connected to said second input of said operational amplifier and a second terminal, a fifth MOSFET (303) having a source-drain path connected between said second terminal of said second gain control resistor ($R_3$) and ground and a gate receiving said second control signal (SW2);

wherein in said first configuration said second control signal (SW2) turns said fifth MOSET (303) ON causing said output amplifier section to have a first gain; and wherein in said second configuration said second control signal (SW2) turns said fifth MOSET (303) OFF causing said output amplifier section to have a second gain.

* * * * *